United States Patent

Kawahara et al.

[11] Patent Number: 6,154,866
[45] Date of Patent: Nov. 28, 2000

[54] REPRODUCING APPARATUS, ERROR CORRECTING UNIT AND ERROR CORRECTING METHOD

[75] Inventors: Minoru Kawahara; Kenji Yamazaki, both of Kanagawa, Japan

[73] Assignee: Sony Corporation, Tokyo, Japan

[21] Appl. No.: 09/095,701

[22] Filed: May 29, 1998

Related U.S. Application Data

[63] Continuation of application No. PCT/JP97/03461, Sep. 29, 1997.

[30] Foreign Application Priority Data

Sep. 30, 1996 [JP] Japan ................................ 8-280047

[51] Int. Cl.[7] ............................ H03M 13/00; G11B 5/09
[52] U.S. Cl. .................... 714/755; 714/758; 714/761; 360/32; 360/48; 360/53; 386/40; 386/124
[58] Field of Search ........................ 714/755, 758, 714/704, 761, 774, 781, 784, 785; 360/8, 32, 48, 53; 386/7, 109, 112, 40, 98, 124

[56] References Cited

U.S. PATENT DOCUMENTS

| 5,054,017 | 10/1991 | Hiroyoshi et al. | 369/275.1 |
|---|---|---|---|
| 5,671,095 | 9/1997 | Arai et al. | 360/8 |
| 5,687,182 | 11/1997 | Shikakura | 714/774 |
| 5,715,262 | 2/1998 | Gupta | 714/784 |
| 5,774,289 | 6/1998 | Seki | 360/48 |
| 5,991,501 | 11/1999 | Higurashi et al. | 386/98 |
| 5,996,103 | 11/1999 | Jahanghir | 714/755 |
| 5,996,109 | 9/1997 | Shikakura | 714/774 |

FOREIGN PATENT DOCUMENTS

| 0 390 510 B1 | 10/1990 | European Pat. Off. . |
|---|---|---|
| 54-24612 | 2/1979 | Japan . |
| 62-145934 | 6/1987 | Japan . |
| 1-154373 | 6/1989 | Japan . |
| 2-257477 | 10/1990 | Japan . |
| 3-148921 | 6/1991 | Japan . |
| 5-308294 | 11/1993 | Japan . |
| 8-130480 | 5/1996 | Japan . |
| 8-204583 | 8/1996 | Japan . |

*Primary Examiner*—Emmanuel L. Moise
*Attorney, Agent, or Firm*—Frommer Lawrence & Haug, LLP.; Williams S. Frommer

[57] ABSTRACT

A first error corrector performs error detection and error correction using inner codes on data subjected to an error correction coding processing with multiplication codes and a second error corrector performs error detection and error correction using outer codes on the data. A condition discriminator discriminates whether or not the data satisfies predetermined conditions, and a controller responds to the discriminator to prevent error detection and error correction using outer codes. Consequently, power for error detection and error correction is consumed only when sufficiently reliable data can be obtained by error detection and error correction using inner codes.

12 Claims, 5 Drawing Sheets

REPRODUCING APPARATUS, ERROR CORRECTING UNIT AND ERROR CORRECTING METHOD

This is a Continuation of International Application PCT/JP97/03461 having an international filing date of Sep. 29, 1997.

TECHNICAL FIELD

The present invention relates to a reproducing apparatus, an error correcting unit and an error correcting method and is suitably applied, for example, to a reproducing apparatus, an error correcting unit and an error correcting method wherein digital data subjected to an error correction coding processing with multiplication codes are reproduced after a decoding processing.

BACKGROUND ART

Conventionally, as a portable equipment, there is a recording/reproducing apparatus such as a digital video cassette recorder. Such a recording/reproducing apparatus can record and reproduce images and voices at any place by being brought because its characteristic is portable, so that it is at present utilized widely. Besides, some of such recording/reproducing apparatuses record inputted video and audio signals in the state of digital signals on a recording medium such as a magnetic tape, and at this time, for the error correction of video and audio signals to be reproduced, add error correction codes generated by an error correction coding processing in order to record. As such an error correction coding processing, coding with multiplication codes is often utilized.

DISCLOSURE OF THE INVENTION

In FIG. 5, Numerals 1 and 2 shows a recording apparatus and a reproducing apparatus respectively, wherein image and voice data composed of analog signals are recorded on a magnetic tape 3 in the state of digital signals after a coding processing by using the recording apparatus 1. Further, the reproducing apparatus 2 performs a reproducing and decoding processing on the data, which are recorded on the magnetic tape 3, to output the data as image and voice data composed of original analog signals.

The recording apparatus 1 inputs image and voice data composed of analog signals as input data S1 via an interface section 4 to supply them to a BRR (Bit Rate Reduction) encoder 5. The BRR encoder 5 performs a predetermined data compression processing on the supplied input data S1 to produce coded data S2. The BRR encoder 5 delivers the produced coded data S2 to an error correction encoder 6.

The error correction encoder 6 temporarily stores the supplied coded data S2 in a RAM 7, wherein data are disposed in the shape of a lattice, for example, with one block forming the coded data S2 as one unit. The error correction encoder 6 performs an error correction coding processing with multiplication codes on the coded data S2 stored in the RAM 7. The error correction encoder 6 performs, for example, a Reed-Solomon coding on the coded data S2 as the error correction coding processing to create correction codes (so-called parity bit). Here, assuming that correction codes obtained by coding in the column direction are outer codes and correction codes obtained by coding in the row direction are inner codes, outer codes and inner codes are referred to as multiplication codes. The error correction encoder 6 attaches the multiplication codes composed of such outer codes and inner codes to the stored coded data S2. Incidentally, in this case, the time series of coded data S2 coincide in the row direction.

The error correction encoder 6 reads out the coded data S2, which is subjected to such error correction coding processing, along the row direction from the RAM 7 and supplies them to a record drive section 8 as record data S3. The record drive section 8 comprises an amplifier and the like for recording, and records the record data S3, which is subjected to the error correction coding processing, on the magnetic tape 3 via a magnetic head 9.

The reproducing apparatus 2 reads out the record data S3, which is recorded on the magnetic tape 3 in this way, via a magnetic head 10 as reproduction data S4. The reproducing apparatus 2 supplies the reproduction data S4 to an inner code decoder 12 via an equalizer 11. The inner code decoder 12 performs a sampling on the reproduction data S4 with a predetermined sampling frequency to convert them into reproduction data. Then, the error correction processing is performed on this reproduction data. The reproduction data for one track is composed of a data unit called a plurality of SYNC blocks. The error correction processing in the inner code decoder 12 is performed with this SYNC block unit. The inner code decoder 12 performs the decoding processing according to inner codes attached to each row of the reproduction data S4, to detect whether or not there is an error for each row. When errors are actually detected by such error detection, the inner code decoder 12 performs an error correction. Besides, the inner code decoder 12 attaches an error flag to the row in which errors are detected in the reproduction data S4. The error flag is attached in a case where errors have remained without being corrected because the number of detected errors exceeds the capability of error correction according to error correction codes, and is attached to all symbols of the row in which errors have been detected to indicate the presence of errors.

This reproduction data S4 subjected to the error correction according to inner codes are written in a RAM 13. Next, the inner code decoder 12 reads out the reproduction data S4, which is subjected to the error correction according to inner codes as described above, from the RAM 13 to supply them to an outer code decoder 14. At this time, the inner code decoder 12 address-controls the RAM 13 to read out the reproduction data S4 along the column direction. In this way, the data sequence of the reproduction data S4 are changed and read out in the direction of outer codes.

The reproduction data S4, which is changed and read out in the direction of outer codes as described above, is supplied to the outer code decoder 14 to be subjected to the error correction according to outer codes by the outer code decoder 14. That is, the error correction is performed for each column on the basis of the outer code parity which is arranged to each column of data. At the time of performing this error correction according to outer codes, the error flags, which are attached to individual symbols at the time of decoding in the inner code decoder 12, are also used together with outer codes.

The outer code decoder 14 performs a decoding processing based on outer codes, which are attached to individual columns of the reproduction data S4, to detect whether or not there are errors for each column. When errors are actually detected by the error detection, the outer code decoder 14 performs the error correction. Besides, the outer code decoder 14 attaches an error flag to a column in which errors have been detected in the reproduction data S4. The error flags are attached in a case where errors have remained without being corrected because the number of detected errors exceeds the capability of error correction according to error correction codes, and are attached to symbols of which positions can be specified by the error flags, attached by the inner code decoder 12, and the outer code decoder 14.

The outer code decoder 14 reads out the reproduction data S4, which is subjected to the error correction according to outer codes as described above, from the RAM 15. At this time, the outer code decoder 14 address-controls the RAM 15 to read out the reproduction data S4 along the row direction. In this way, the reproduction data S4 are read out in the sequence of inner codes, i.e., in the original data sequence. The reproduction data S4, subjected to the error correction according to inner codes and outer codes as described above, are supplied to a BRR decoder 16 as coded data S5.

The BRR decoder 16 receives the coded data S5, releases the data compression by a decoding processing, and then outputs the resultant data as output data S6 composed of image and voice data via an interface 17. Incidentally, data, to which error flags are attached because the correction has not finished by the error correction processing according to inner codes and outer codes, are corrected by using a technique such as, e.g., interpolation after the decoding processing.

By the way, the reproducing apparatus 2 having the aforementioned configuration reproduces data recorded with error correction codes attached by the error correction coding processing according to multiplication codes, and performs the error detection and correction processing according to inner codes and the error detection and correction processing according to outer codes in succession, in order to detect whether or not errors occur in the recorded data, and is so arranged as to make a correction if errors occur.

That is, by performing the error detection and correction processing according to inner codes and the error detection and correction processing according to outer codes together, the reproducing apparatus 2 is so arranged as to detect and correct errors which cannot be detected and corrected only by the error detection and correction processing according to inner codes, by the error detection and correction processing according to outer codes.

However, actually, errors occurring in the recorded data can be detected and corrected in most cases by the error detection and correction processing only according to inner codes. Specifically, as shown in FIGS. 6 and 7, the number of errors that cannot be detected and corrected by the error detection and correction processing only according to inner codes is 1% or less per one track of the magnetic tape 3. Accordingly, the actual working ratio in the error detection and correction processing according to outer codes can be said to be 1% or less. Incidentally, FIG. 7 is a logarithmic table of the number of errors per track shown in FIG. 6.

In this way, in the reproducing apparatus 2, though the error detection and correction processing can be performed only according to inner codes, the error detection and correction processing according to outer codes is also performed. As a result, the driving of the outer code decoder 14 and the Ram 15 (FIG. 5) have a problem in that a lot of wasteful power are consumed.

In the case of portable equipment, such wasteful power consumption causes an decrease in a period of drivable time.

In consideration of these, the present invention intends to provide a reproducing apparatus, an error correcting unit and an error correcting method capable of preventing wasteful power consumption while keeping the data reliability.

To solve these problems, the present invention comprises first error correction processing means for performing an error detection and error correction processing on data subjected to an error correction coding processing with multiplication codes, by using inner codes, second error correction processing means for performing an error detection and error correction processing on the data by using outer codes, condition discriminating means for discriminating whether or not the data satisfy predetermined conditions, and control means for controlling the second error correction processing means in accordance with the discrimination results to forbid the error detection and error correction processing according to outer codes.

By discriminating whether or not the data satisfy predetermined conditions to forbid the error detection and error correction processing according to outer codes only when the conditions are satisfied, the error detection and error correction processing according to outer codes can be omitted if reliable data can be sufficiently obtained by the error detection and error correction processing only according to inner codes, thus the consumed power can be saved.

BEST MODE FOR CARRYING OUT THE INVENTION

One embodiment according to the present invention will be described in detail in reference to the following drawings.

Figure 1:
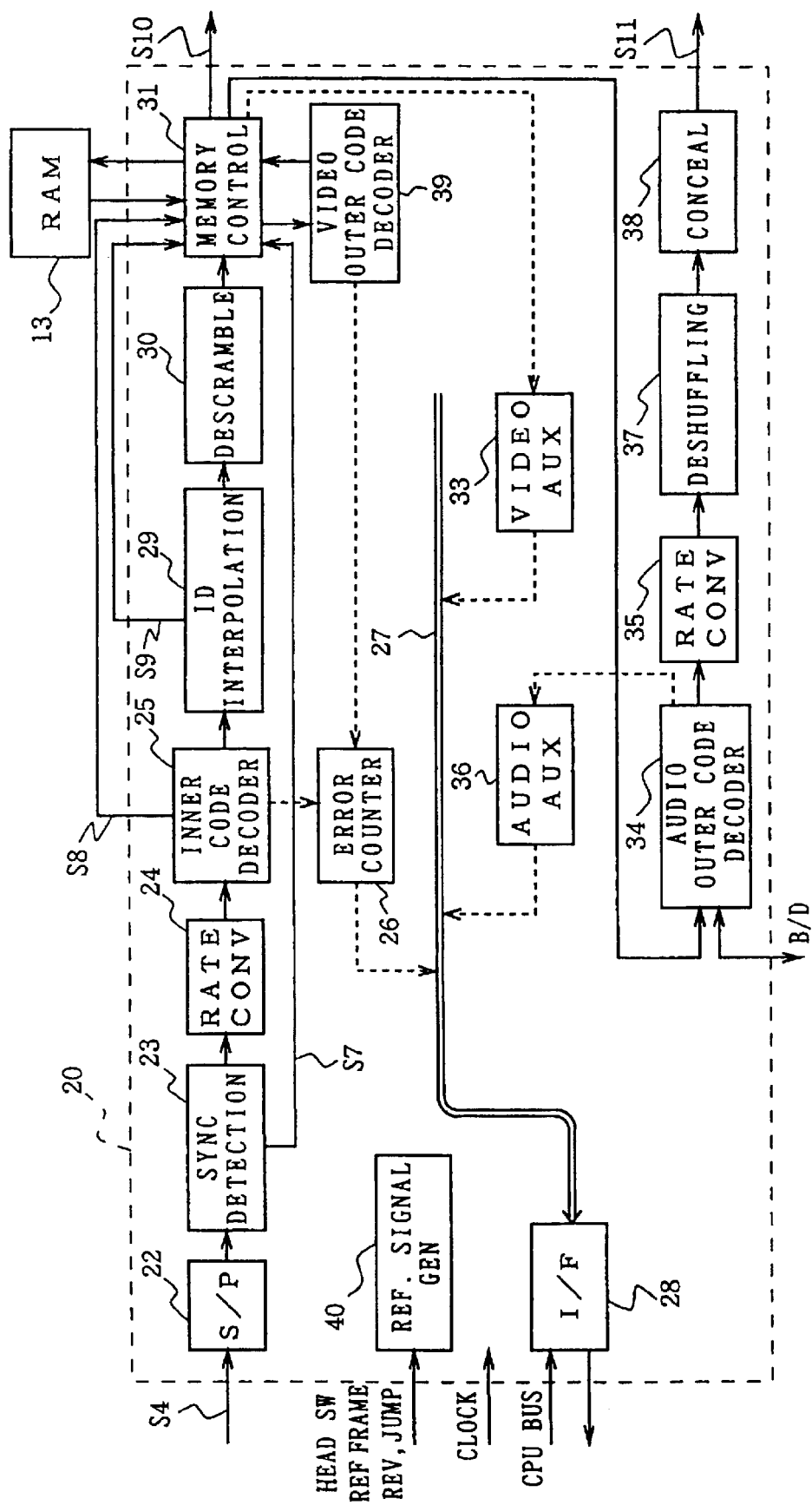
FIG. 1 is a block diagram showing the configuration of an error correcting unit according to an embodiment of the present invention.
Figure 5:
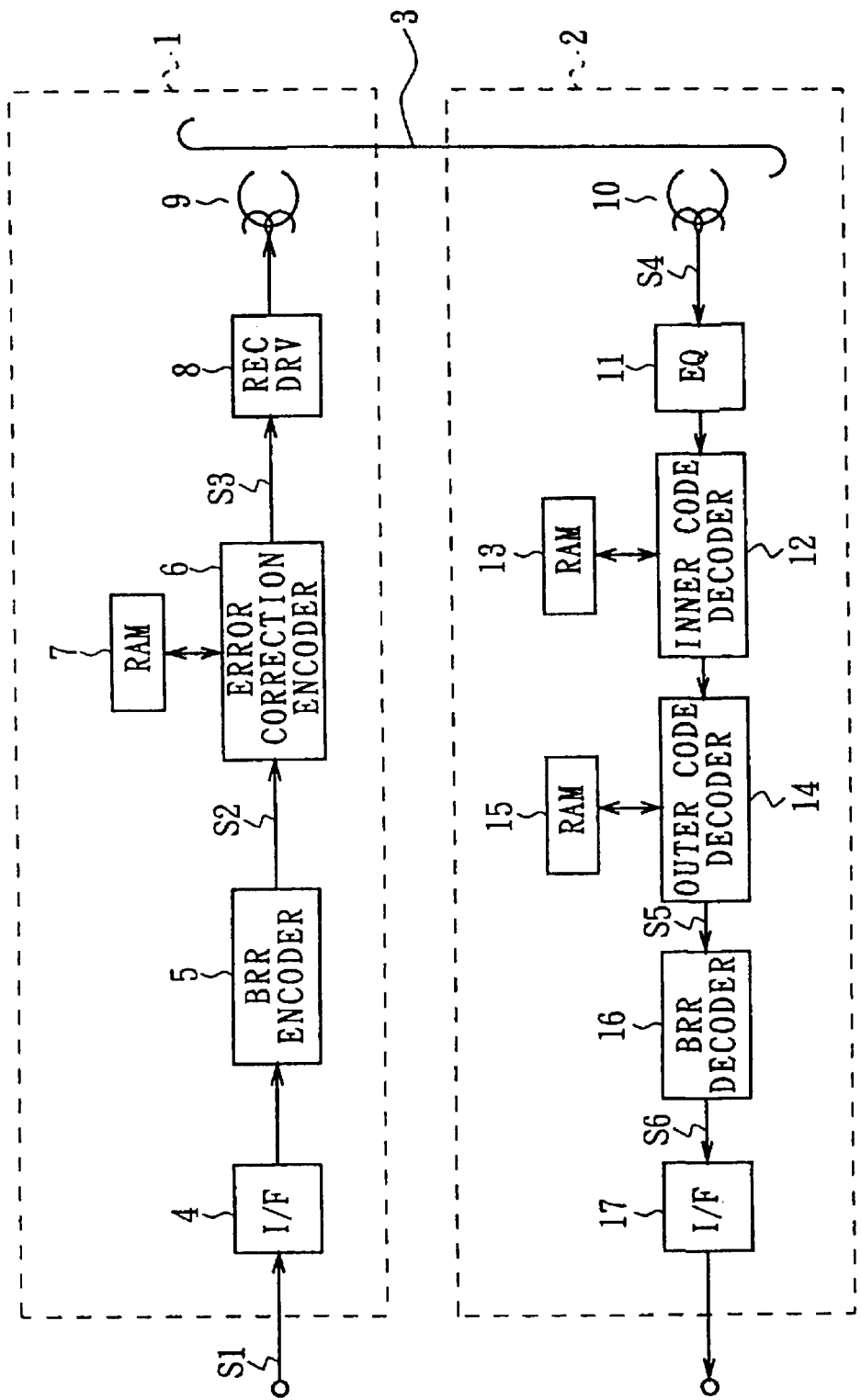
FIG. 5 is a block diagram showing the configuration of a conventional recording apparatus and reproducing apparatus.
Figure 6:
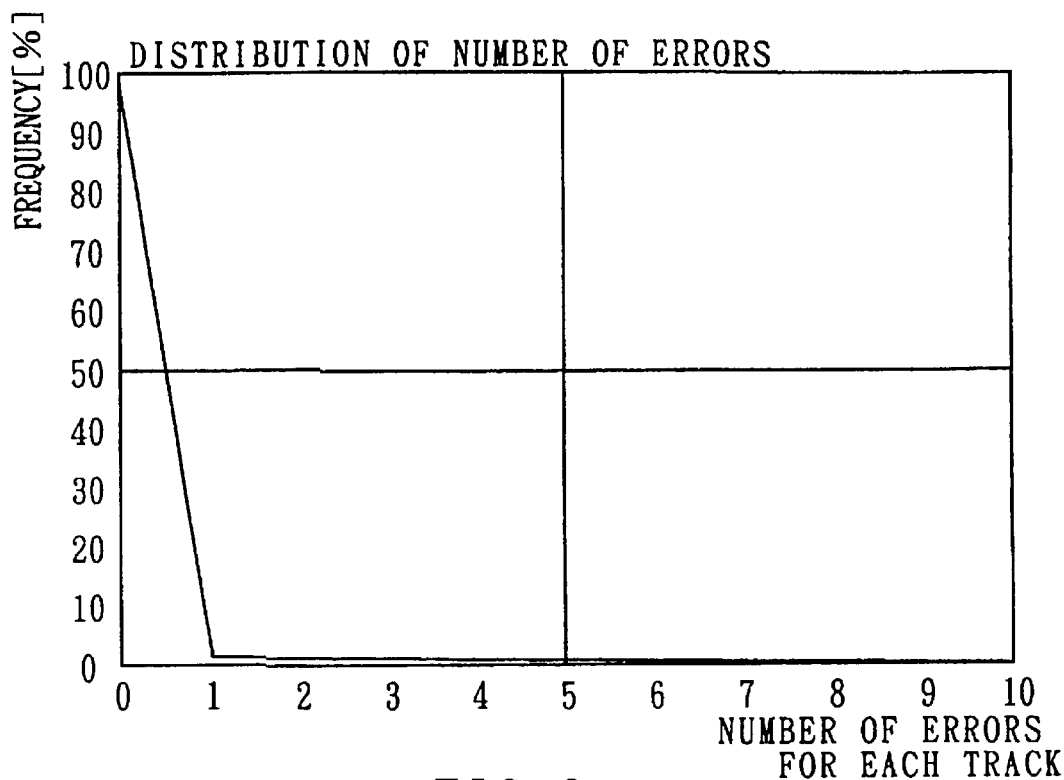
FIG. 6 is a graph showing the error frequency for each track in an error detection and correction processing only according to inner codes.
Figure 7:
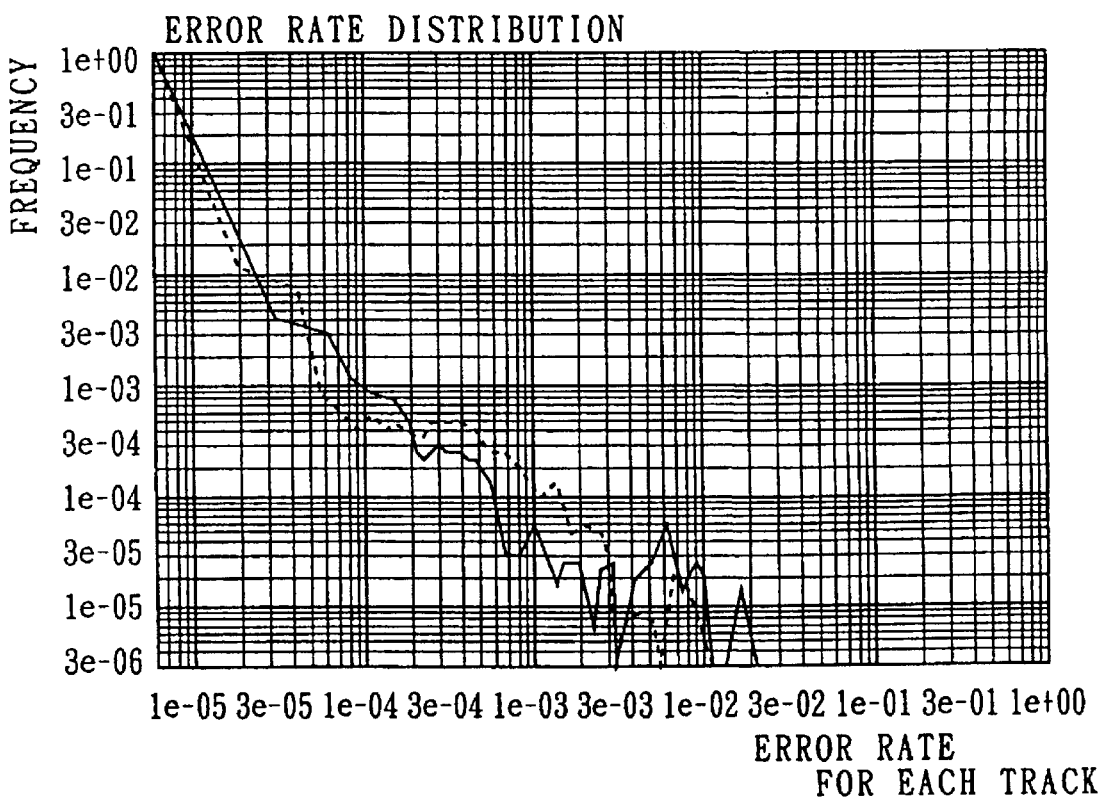
FIG. 7 is a graph showing the error frequency for each track in the error detection and correction processing only according to inner codes.

In FIG. 1 in which the same reference numerals are applied to parts corresponding to FIG. 5, numeral 20 shows an error correcting unit, which is provided in place of an inner code decoder 12 and an outer code decoder 14 in the portable type of a reproducing apparatus 2. In the reproducing apparatus 2 which reproduces adjacent tracks of which azimuthal angles differ from each other with a pair of reproducing magnetic heads having different angles from each other, the error correcting units 20 are provided corresponding to respective heads in a pair of reproducing magnetic heads 10 (FIG. 5) having different angles from each other. That is, reproduction data from one reproducing head are supplied to one error correcting unit, and reproduction data from the other reproducing head are supplied to the other error correcting unit. In this case, since both the error correcting units have the same construction, here only one error correcting unit 20 will be explained, the explanation of the other error correcting unit 20 is omitted.

The reproducing apparatus 2 reads out record data S3, which is recorded on the magnetic tape 3 (FIG. 5) after being subjected to a predetermined data compression and an error correction coding processing, via the magnetic head 10 and equalizer 11 (FIG. 5). The reproducing apparatus 2 inputs record data S3, read out from the magnetic tape 3, to the error correcting unit 20 as reproduction data S4. Here, the reproduction data S4 has been subjected to the error correction coding processing using multiplication codes by the recording apparatus 1 (FIG. 5).

Figure 2:
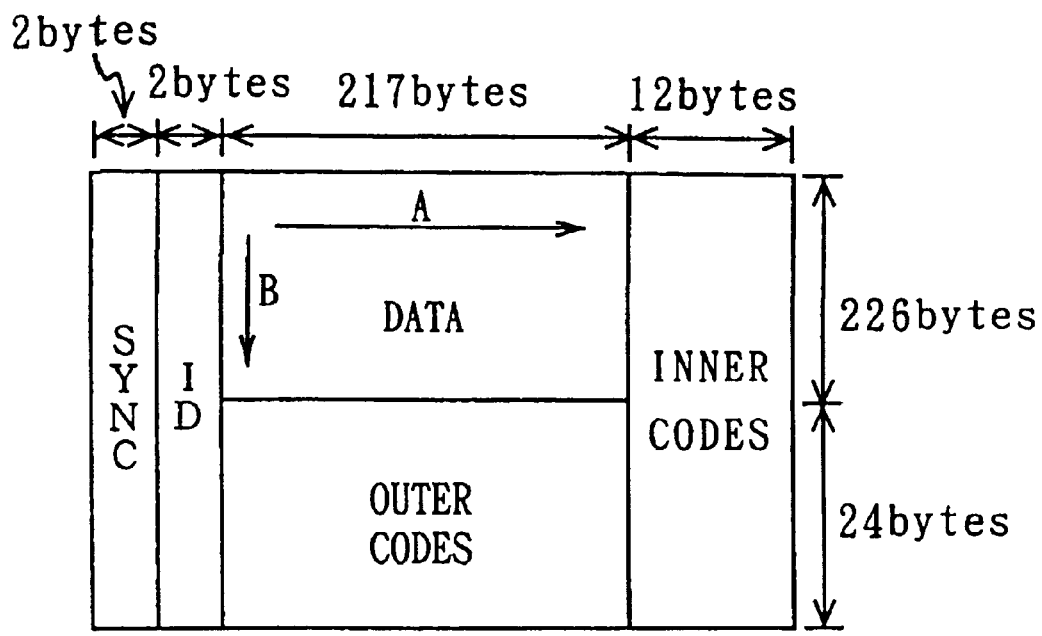
FIG. 2 is a schematic chart of the configuration of an error correction block.

FIG. 2 is a schematic diagram showing the configuration of an error correction block. In the embodiment according to the present invention, data for one frame is comprised of 12 tracks formed on the magnetic tape, and each track of 12 tracks is comprised of one error correction block shown in FIG. 2. In video data and audio data, an error correction block is individually formed. Here, only an error correction block of the video data will be described. For example, in video data formed in the data arrangement of 217 bytes×226 bytes, data in each row are coded, for example, with (250, 226) lead solomon codes in the direction of arrow B in order to create outer code parity having 24 bytes. Further, in these video data and outer code parity, data in each row are coded, for example, with (229, 217) lead solomon codes in the direction of arrow A in order to create inner code parity having 12 bytes. Furthermore, in the head of each row of data, SYNC data and ID data having 2 bytes respectively are arranged.

Figure 3:
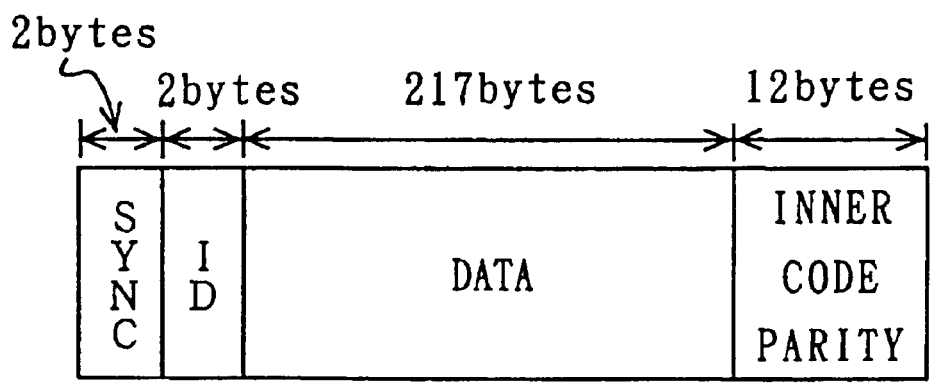
FIG. 3 is a diagram of 1 SYNC block in the error correction block.

FIG. 3 shows a diagram showing the configuration of 1 SYNC block of these error correction blocks in the video data. The 2 bytes in the head are SYNC data representing synchronous information, and the following 2 bytes are ID data representing identification information on blocks. The number in one track of this SYNC block and the number of the SYNC block are inscribed. Video data (or outer code parity) having 217 bytes and inner code parity follow these. The reproduction data S4 which is reproduced from the magnetic tape are continuous SYNC blocks.

The error correcting unit 20 supplies such reproduction data S4 to a serial/parallel converting section 22 (hereinafter, referred to as S/P converting section 22). Since the reproduction data S4 are supplied as serial bit data, the S/P converting section 22 converts the reproduction data S4 into data having a parallel 8 bit data form, and then supplies them to an SYNC detecting section 23.

The SYNC detecting section 23 extracts SYNC (synchronous) data from the reproduction data S4, and delivers the reproduction data S4 to a rate converter 24 after extraction. In this connection, the reproducing apparatus 2 reproduces data while keeping the synchronicity in accordance with thus extracted SYNC data. Besides, the SYNC detecting section 23 detects whether or not SYNC data are obtained perfectly in extraction. Furthermore, since the SYNC data are recorded for each definite period, the SYNC detecting section 23 detects whether or not disorder occurs in the period of SYNC data in extraction. If the detection result reveals that the SYNC data are perfectly obtained and no disorder occurs in period, the SYNC detecting section 23 supplies a confirmation notification signal S7 to a memory control section 31 described later.

The rate converter 24 has a FIFO (not shown) inside, and performs a replacement of the clock for the reproduction data S4 to be supplied by using the FIFO, and delivers the reproduction data S4 after the data rate thereof is converted into a higher rate. In this way, the conversion into the higher rate is performed because the write-in and readout of data in the memory control section 31 described later is performed at the time division processing.

The rate converter 24 supplies the reproduction data S4, of which the data rate is converted into a higher data rate as described above, to an inner code decoder 25.

The inner code decoder 25 inputs the reproduction data S4 and performs the error detection and error correction processing according to inner codes for each SYNC block. The inner code decoder 25 sends the reproduction data S4, subjected to the error detection and error correction processing, to an ID interpolation section 29. Besides, if errors exceeding the error correcting capability are detected in the error detection and error correction processing, the inner code decoder 25 does not performs the error correction, but sends the reproduction data S4 with error flags indicating the presence of errors attached. Furthermore, the inner code decoder 25 detects whether or not all SYNC blocks could be corrected by the error detection and error correction processing and whether or not the number of SYNC blocks in which errors are detected and corrected exceeds a previously set standard value. That is, even if all errors can be corrected by the error correction processing using the inner code decoder 25, there is a high possibility of error correction to occur in the case where the number of error correction is above a standard value. Accordingly, the inner code decoder 25 discriminates whether or not the number of SYNC blocks subjected to the error correction is a standard value or less. If all SYNC blocks can be corrected and the number of SYNC blocks subjected to the error correction is a standard value or less, the inner code decoder 25 supplies a confirmation notification signal S8 to the memory control section 31 described later.

Besides, the inner code decoder 25 supplies the error correction information, obtained in the error detection and error correction processing, to an error counter 26. In accordance with this error correction information, the error counter 26 counts the number of errors in the inner code decoder 25. The error counter 26 supplies thus counted number of errors to an interface section 28 via a bus 27.

On the other hand, the ID interpolation section 29 inputs the reproduction data S4 to detect the ID data for each SYNC block. Since the ID data have continuity in the time series direction in the sequence of supplied SYNC blocks, the ID interpolation section 29 compares the count value with the detected ID data while performing a continuous count in order to discriminate the continuity of the ID data. If the count value and the detected ID data are not coincident according to the discrimination, the ID interpolation section 29 performs a replacement of ID data in accordance with the count value. Alternately, if the discrimination result reveals that the count value and the detected ID data are coincident, the ID interpolation section 29 supplies a confirmation notification signal S9 to the memory control section 31 described later.

The ID interpolation section 29 detects the ID data in this manner and then supplies the reproduction data S4 which is subjected to a replacement of ID data, to a descramble section 30 when discontinuity is detected.

For example, in the case where the reproduction data S4 are enciphered by a predetermined coding processing with the recording apparatus 1 (FIG. 5), the descramble section 30 cancels the enciphering of the reproduction data S4 by performing the reverse processing to this enciphering processing. After the cancel of the deciphering processing, the descramble section 30 supplies the reproduction data S4 to the memory control section 31.

The memory control section 31 stores the supplied reproduction data S4 into the RAM 13. Only when all of confirmation notification signals S7, S8 and S9 are given, the memory control section 31 decides that the error detection and error correction according to outer codes are unnecessary and reads out the reproduction data S4 from the RAM 13. The memory control section 31 supplies the reproduction data S4 composed of read-out image data to a video AUX section 33 and moreover, outputs them as a reproduction video signal S10, and further sends the reproduction data S4 composed of voice data to an audio outer code decoder 34.

The video AUX section 33 extracts VAUX data from the reproduction data S4 composed of image data and sends them to an external equipment (not shown) via the bus 27 and the interface section 28. Besides, the audio outer code decoder 34 performs the error detection and error correction according to outer codes on the reproduction data S4 composed of voice data to give the rate converter 35 and to an audio AUX section 36. The rate converter 35 replaces the clock of the reproduction data S4 composed of voice data to the clock of an audio signal and performs a rate conversion, to supply them to a deshuffling section 37. Further, the audio AUX section 36 extracts AAUX data from the reproduction data S4 composed of voice data and sends them to an external equipment (not shown) via the bus 27 and the interface section 28. The deshuffling section 37 rearranges the reproduction data S4 composed of voice data along the time axis direction and sends them to a conceal section 38. In accordance with error flags attached to the reproduction data S4 composed of voice data, the conceal section 38 performs a data correction to output the resultant data as reproduction audio data S11.

On the other hand, in the case where any one of confirmation notification signals S7, S8 and S9 is not given, the memory control section 31 decided that the error detection and error correction according to outer codes is necessary and reads out the reproduction data S4 from the RAM 13. The memory control section 31 supplies the read-out reproduction data S4 composed of image data to a video outer code decoder 39. At this time, the memory control section 31 address-controls the RAM 13 to reads out the reproduction data S4 along the outer code direction.

The video outer code decoder 39 inputs the reproduction data S4 and performs the error detection and error correction processing according to outer codes for each 1 SYNC block. The video outer code decoder 39 supplies the reproduction data S4, subjected to the error detection and error correction processing, to the memory control section 31, and the memory control section 31 stores the reproduction data S4 along the original inner code direction. Alternatively, if errors exceeding the error correction capability are detected in the error detection and error correction processing, the video outer code decoder 39 does not performs the error correction but attaches error flags indicating the presence of errors to the reproduction data S4 to supply them to the memory control section 31.

Furthermore, the video outer code decoder 39 supplies the error correction information, obtained in the error detection and error correction processing, to the error counter 26. In accordance with this error correction information, the error counter 26 counts the number of errors in the video outer code decoder 25. The error counter 26 supplies thus counted number of errors together with the aforementioned number of errors in the inner code decoder 25 to the interface section 28 via the bus 27.

Incidentally, the error correcting unit 20 is so arranged that various timing signals to be used therein are generated by a reference signal generating section 40.

In this way, in accordance with whether or not predetermined conditions are satisfied, the error correcting unit 20 decides whether or not the reproduction data S4 are subjected to the error detection and error correction according to outer codes, thereby the error detection and error correction according to outer codes is omitted if all errors can be detected and corrected only according to inner codes.

In accordance with the control procedure described below, the error correcting unit 20 discriminates using the memory control section 31 whether or not the error detection and error correction according to outer codes is omitted, and controls the drives of the RAM 13 and the video outer code decoder 39 in accordance with the discrimination result.

Figure 4:
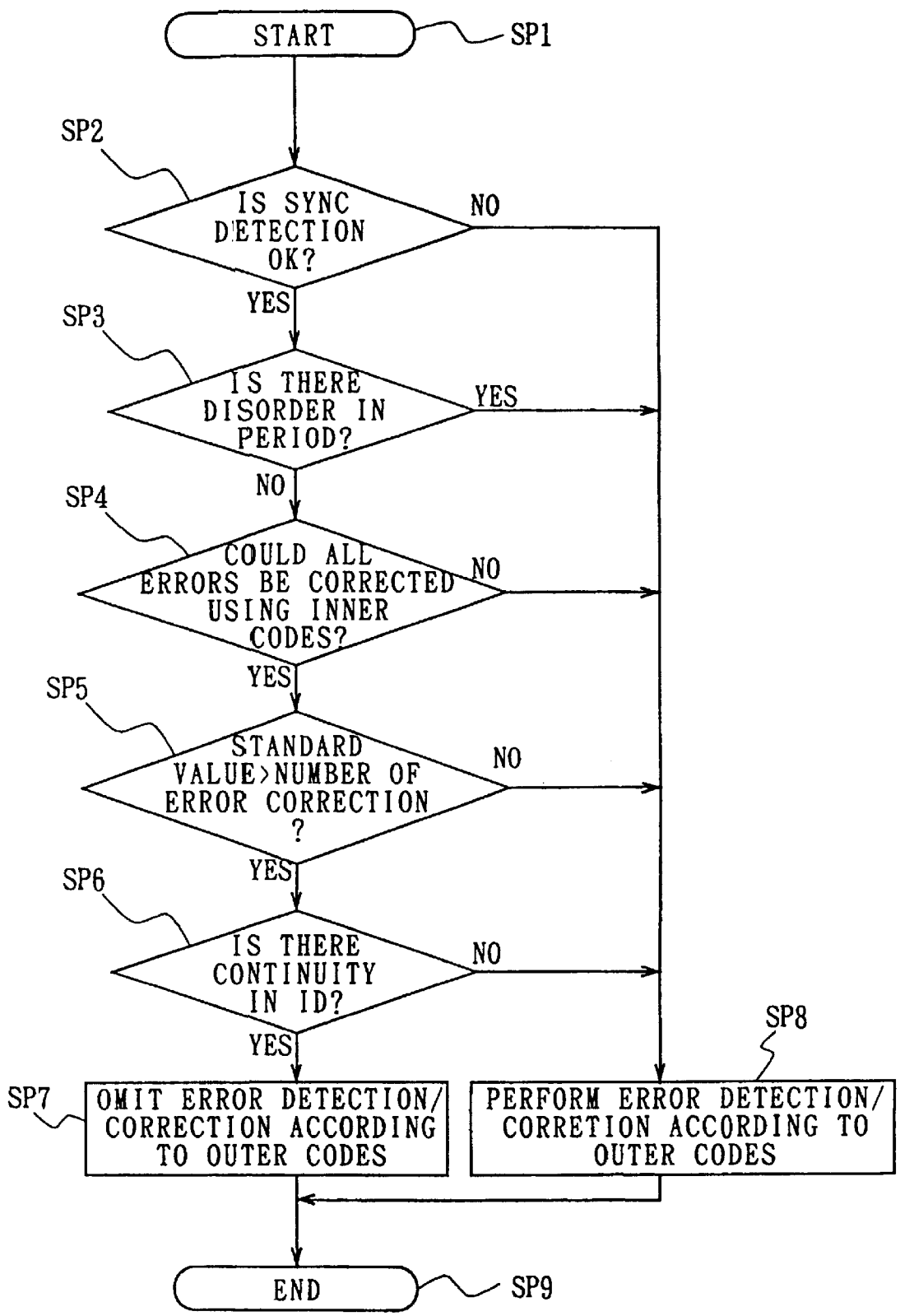
FIG. 4 is a flowchart explaining predetermined conditions and discriminating procedure for discriminating whether or not an error detection and error correction processing according to outer codes should be executed.

That is, as shown in FIG. 4, the error correcting unit 20 starts the procedure at step SP1. At step SP2, the error correcting unit 20 discriminates using the SYNC detecting section 23 whether or not all SYNC data could be detected. The error correcting unit 20 jumps to step SP8 if all SYNC data could not be detected, or otherwise the procedure proceeds to step SP3 if all SYNC data could be detected. Next, at step 3, the error correcting unit 20 discriminates using the SYNC detecting section 23 whether or not there is the disorder of a period in the SYNC data. The error correcting unit 20 jumps to step SP8 if there is the disorder in a period, and proceeds to step SP4 if there is not the disorder in a period. Here, the error correcting unit 20 gives notice of the discrimination results by the steps SP2 and SP3 by using the confirmation notification signal S7 to be supplied from the SYNC detecting section 23 to the memory control section 31.

Besides, at step SP4, the error correcting unit 20 discriminates using the inner code decoder 25 whether or not all errors could be corrected by the error detection and error correction according to inner codes. The error correcting unit 20 jumps to step SP8 if some errors could not been corrected, or otherwise proceeds to step SP5 if all errors could been corrected. Next, at step SP5, the error correcting unit 20 discriminates using the inner code decoder 25 whether or not the number of SYNC blocks in which errors are detected and the error correction processing according to inner codes is performed is a standard value or more. The error correcting unit 20 jumps to step SP8 if it is the standard value or more, or otherwise proceeds to step SP6 if it is the standard value or less. Here, the error correcting unit 20 gives notice of the discrimination results by steps SP4 and SP5 by using the confirmation notification signal S8 to be supplied from the inner code decoder 25 to the memory control section 31.

Subsequently, at step SP6, the error correcting unit 20 discriminates using the ID interpolation section 29 whether or not there is continuity in the ID data. Specifically, the error correcting unit 20 detects the ID number for each SYNC block of the reproduction data S4 with the ID interpolation section 29 to discriminate whether or not there is continuity in the ID data in accordance with whether or not there is continuity in this ID number. The error correcting unit 20 jumps to the step SP8 if there is no continuity, or proceeds to next step if there is continuity. Here, the error correcting unit 20 gives notice of the discrimination result by the step SP6 by using the confirmation notification signal S9 to be supplied from the ID interpolation section 29 to the memory control section 31.

In this way, if predetermined conditions are satisfied in the discriminations at steps SP2 to SP6, the error correcting unit 20 omits the error detection and error correction according to outer codes at the step SP7 by the memory control section 31. Specifically, if all SYNC data can be detected without disorder of period (SP2 and SP3) and the number of SYNC blocks in which errors are detected is a standard value or less and all errors can be corrected according to inner codes (SP4 and SP5) and continuity is recognized in all ID data (SP6), the memory control section 31 decides that the reproduction data S4 has sufficient data reliability and all errors can be corrected by the error detection and error correction only according to inner codes, and omits the error detection and error correction according to outer codes.

On the other hand, if even one of the above conditions is not satisfied, the memory control section 31 decides at step SP8 that only the error detection and error correction according to inner codes is insufficient and executes the error detection and error correction processing according to outer codes. Thus, at the step SP9, the error correcting unit 20 finishes the procedure.

Incidentally, the application of individual sections of a conventional error correcting unit can cope with the arrangement for detecting individual conditions in the aforementioned procedure, and it can be realized without the provision of an especially substantial additional configuration.

In the aforementioned configuration, if the aforementioned predetermined conditions are satisfied, the error correcting unit 20 decides that the error detection and error correction according to outer codes can be omitted, and the video outer code decoder 39 is prevented from being driven by the control of the memory control section 31.

First, in the detection of SYNC data, if all SYNC data could not be detected or disorder is recognized in a period, there is a high possibility that errors which can not corrected only according to inner codes occur in image and voice data themselves, so that image and voice data recorded in one SYNC block in which such SYNC data are detected are considered to have no sufficient data reliability.

By discriminating whether or not the number of SYNC blocks in which errors are detected is a previously set standard value or less as well as whether or not all errors can be corrected by the error detection and error correction processing according to inner codes, it is discriminated whether or not the error detection and error correction processing only according to inner codes is sufficient. If there is even one of SYNC blocks in which errors cannot be corrected, it is needless to mention that the precision of error correction is improved by performing the error detection and error correction processing not only according to inner codes but also according to outer codes. In addition to this, if the number of SYNC blocks in which errors are detected exceeds a standard value, the error detection and error correction processing according to outer codes is not omitted. That is because, when there is a SYNC block in which errors frequently occur like this, there is a possibility that error corrections occur in the error detection and error correction processing of such data only according to inner codes, and it cannot always be said that the data reliability is high.

Furthermore, it is discriminated whether there is continuity in ID data. Generally, ID data is so arranged that continuous numbers are assigned to continuous individual SYNC blocks. If no continuity is recognized in such ID data, since there is a possibility that loss of data occurs in image and voice data and the like, the data reliability is not said to be sufficiently high, so that the error detection and error correction processing according to outer codes is executed without be omitted.

As described above, it is decided that a sufficient data reliability is obtained by the error detection and error correction processing only according to inner codes only when all of the aforementioned conditions are satisfied, thereby the error correcting unit 20 can omit the error detection and error correction processing according to outer codes while keeping a sufficient data reliability. Thus, the drive of the video-outer code decoder 39 and the access control to the RAM 13 accompanying the readout of the reproduction data S4 to be supplied to the video outer code decoder 39 can be omitted, thereby decreasing the consumed power.

Besides, in the error correcting unit 20, the control of the video outer code decoder 39 by such discrimination procedure can be performed only by some additions using appropriation of a circuit to an error correcting unit of conventional configuration, thus the configuration can be simplified.

According to the aforementioned configuration, by the confirmation notification signals S7 to S9, which are detection results of the SYNC detecting section 23, inner code decoder 25 and ID interpolation section 29, the memory control section 31 discriminates whether or not the reproduction data S4 satisfy predetermined conditions, it is decided that data having a sufficient reliability can be obtained only by the error detection and error correction processing using the inner code decoder 25 if predetermined conditions are satisfied, and the error detection and error correction processing according to outer codes in the video outer code decoder 39 is omitted. As a result, the error correcting unit 20 can save the consumed power by omitting the error detection and error correction processing according to outer codes and can avoid a useless power consumption while keeping a sufficient data reliability with a simple configuration.

Incidentally, in the aforementioned embodiment, a case of the error correcting unit 20 provided in the portable reproducing apparatus 2 has been described, however, the present invention is not limited to this and may be applied, for example, to an error correcting unit provided in the stationary type of reproducing apparatus. A similar effect of saving the power consumption to the embodiment is sufficiently obtained also in this case.

Further, in the aforementioned embodiment, a case of performing a predetermined data compression and error correction coding processing on image and voice data to record them on the magnetic tape 3 has been described, however, the present invention is not limited to this and may be applied, for example, to a case of recording on a magnetic disk. In other words, the effect of the embodiment can be obtained independently of the type of record medium.

Furthermore, in the aforementioned embodiment, a case of storing the reproduction data S4 supplied to the memory control section 31 into the RAM 13 has been described, however, the present invention is not limited to this and may be applied, for example, to a case of using an SDRAM. In other words, irrespective of types of memory means, any memory may be employed.

According to the present invention as described above, first error correction processing means for performing the error detection and error correction processing using inner codes on data subjected to the error correction coding processing with multiplication codes, second error correction processing means for performing the error detection and error correction processing using outer codes on the data, condition discriminating means for discriminating whether or the data satisfy predetermined conditions, and control means for controlling the second error correction processing means in accordance with the discrimination result to forbid the error detection and error correction processing according to outer codes are provided, and it is discriminated whether or not the data satisfy predetermined conditions, in order to forbid the error detection and error correction processing according to outer codes only when predetermined conditions are satisfied, so that the error detection and error correction processing according to outer codes can be omitted and the consumed power can be saved when sufficiently reliable data can be obtained by the error detection and error correction processing only according to inner codes, thus enabling useless power consumption to be avoided while keeping the data reliability.

INDUSTRIAL APPLICABILITY

A reproducing apparatus, an error correcting unit, and an error correcting method according to the present invention are adapted, for example, to a case of decoding and reproducing digital data subjected to an error correction coding processing with multiplication codes.

We claim:

1. A reproducing apparatus comprising:
   first error correction processing means for performing an error detection and error correction processing using inner codes on coded data, which is subjected to an error correction coding processing with multiplication codes and read out from a predetermined record medium;
   second error correction processing means for performing an error detection and error correction processing using outer codes on said coded data;
   condition discriminating means for discriminating whether or not said coded data satisfy predetermined conditions;
   control means for forbidding the error detection and error correction processing by said second error correction processing means in accordance with said discrimination result;
   decoding means for performing a decoding processing on said coded data subjected to the error detection and error correction by said first error correction processing means and/or said second error correction processing means; and
   reproduction outputting means for outputting data subjected to said decoding processing.

2. The reproducing apparatus according to claim 1, wherein:
   said condition discriminating means comprises
      synchronous detecting means for detecting synchronous data for each inner code block forming said coded data; and
   the yes or no of detection of said synchronous data and the presence or absence of periodicity in said synchronous data are set to said predetermined conditions.

3. The reproducing apparatus according to claim 1, wherein:
   said condition discriminating means serves for said first error correction means; and
   the yes or no of correction of all errors by said error detection and error correction processing using inner codes and whether or not the number of inner code blocks forming said coded data in which errors are detected in the error detection and error correction processing according to inner code is a previously set standard value or less are set to said predetermined conditions.

4. The reproducing apparatus according to claim 1, wherein:
   said condition discriminating means comprises
      ID detecting means for detecting an ID number attached to each inner code block forming said coded data; and
   the presence or absence of continuity in said ID numbers is set to said predetermined conditions.

5. An error correcting unit comprising:
   first error correction processing means for performing an error detection and error correction processing using inner codes on data subjected to an error correction coding processing with multiplication codes;
   second error correction processing means for performing an error detection and error correction processing using outer codes on said data;
   condition discriminating means for discriminating whether or not said data satisfy predetermined conditions; and
   control means for forbidding the error detection and error correction processing by said second error correction processing means in accordance with said discrimination result.

6. The error correcting unit according to claim 5, wherein:
   said condition discriminating means comprises
      synchronous detecting means for detecting synchronous data for each inner code block forming said data; and
   the yes or no of detection of said synchronous data and the presence or absence of periodicity in said synchronous data are set to said predetermined conditions.

7. The error correcting unit according to claim 5, wherein:
   said condition discriminating means serves for said first error correction means; and
   the yes or no of correction of all errors by said error detection and error correction processing using inner codes and whether or not the number of inner code blocks forming said coded data in which errors are detected in the error detection and error correction processing according to inner code is a previously set standard value or less are set to said predetermined conditions.

8. The error correcting unit according to claim 5, wherein:
   said condition discriminating means comprises
      ID detecting means for detecting an ID number attached to each inner code block forming said data; and
   the presence or absence of continuity in said ID numbers is set to said predetermined conditions.

9. An error correcting method comprising:
   a condition discriminating step for discriminating whether or not data subjected to an error correction coding processing with multiplication codes satisfy predetermined conditions; and
   a correction processing control step for performing an error detection and error correction processing only according to inner codes on said data if said predetermined conditions are satisfied or otherwise for performing an error detection and error correction processing according to outer codes on said data after performing said error detection and error correction processing according to inner codes if said predetermined conditions are not satisfied.

10. The error correcting method according to claim 9, wherein said condition discrimination step detects synchronous data for each inner block forming said data to detect all the synchronous data, and decide that said data satisfy said predetermined conditions if there is a periodicity in the synchronous data.

11. The error correcting method according to claim 9, wherein said condition discriminating step decides that said data satisfy said predetermined conditions if all errors can be corrected by said error detection and error correction processing using inner codes and the number of inner code blocks forming said coded data in which errors are detected in said error detection and error correction processing is a previously set standard value or less.

12. The error correcting method according to claim 9, wherein said condition discriminating detects an ID number attached to each inner code block forming said data and then decides that said data satisfy said predetermined conditions if there is a continuity in the detected ID numbers.

* * * * *